(12) United States Patent
Li et al.

(10) Patent No.: US 8,421,938 B2
(45) Date of Patent: Apr. 16, 2013

(54) PIXEL ARRAY

(75) Inventors: Yi-Hui Li, Taipei County (TW);
Yu-Cheng Chen, Hsinchu (TW);
Tsan-Chun Wang, Hsinchu (TW);
Chih-Hung Lin, Taoyuan County (TW);
Tung-Huang Chen, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 390 days.

(21) Appl. No.: 12/788,301

(22) Filed: May 27, 2010

(65) Prior Publication Data
US 2011/0233567 A1 Sep. 29, 2011

(30) Foreign Application Priority Data
Mar. 4, 2010 (TW) ................................ 99106294 A

(51) Int. Cl.
*G02F 1/136* (2006.01)
(52) U.S. Cl.
USPC .................. 349/42; 349/19; 349/33; 349/41; 349/43; 349/46

(58) Field of Classification Search ..................... 349/19, 349/33, 41, 42, 43, 46
See application file for complete search history.

(56) References Cited

U.S. PATENT DOCUMENTS

| | | | |
|---|---|---|---|
| 7,256,763 B2 * | 8/2007 | Kaneki et al. | 345/102 |
| 7,525,169 B2 | 4/2009 | Fan Jiang et al. | |
| 2008/0238817 A1 | 10/2008 | Mamba et al. | |
| 2012/0179923 A1 * | 7/2012 | Sasaki et al. | 713/300 |

* cited by examiner

*Primary Examiner* — Jennifer Doan
(74) *Attorney, Agent, or Firm* — Jianq Chyun IP Office

(57) ABSTRACT

A pixel array is located on a substrate and includes a plurality of pixel sets. Each of the pixel sets includes a first scan line, a second scan line, a data line, a data signal transmission line, a first pixel unit, and a second pixel unit. The data line is not parallel to the first and the second scan lines. The data signal transmission line is disposed parallel to the first and the second scan lines and electrically connected to the data line. Distance between the first and the second scan lines is smaller than distance between the data signal transmission line and one of the first and the second scan lines. The first pixel unit is electrically connected to the first scan line and the data line. The second pixel unit is electrically connected to the second scan line and the data line.

13 Claims, 4 Drawing Sheets

PIXEL ARRAY

CROSS-REFERENCE TO RELATED APPLICATION

This application claims the priority benefit of Taiwan application serial no. 99106294, filed on Mar. 4, 2010. The entirety of the above-mentioned patent application is hereby incorporated by reference herein and made a part of specification.

BACKGROUND OF THE INVENTION

1. Field of the Invention

The invention relates to a display array. More particularly, the invention relates to a pixel array.

2. Description of Related Art

In general, an LCD panel is mainly comprised of an active device array substrate, an opposite substrate, and a liquid crystal layer sandwiched between the active device array substrate and the opposite substrate. The active device array substrate has a display region and a non-display region. A plurality of pixel units are arranged on the display region in an array, and each of the pixel units includes a thin film transistor (TFT) and a pixel electrode connected to the TFT. In addition, a plurality of scan lines and a plurality of data lines are disposed in the display region, and the TFT in each of the pixel units is electrically connected to the corresponding scan line and the corresponding data line. By contrast, signal lines, source drivers, and gate drivers are disposed in the non-display region.

When an LCD panel displays images, pixels in each row in the display panel are sequentially turned on through the gate drivers, and data voltages provided by the source drivers are correspondingly received by each row of pixels within the turn-on period. As such, liquid crystal molecules in each row of pixels are arranged properly based on the data voltages received by the pixels. However, with improvement of resolution of the LCD panel, the number of the gate drivers and the number of the source drivers in the LCD must be increased, which leads to expansion of the non-display region (also referred to as a frame). Accordingly, manufacturing costs of the LCD are raised together with increase in the number of the gate drivers and the number of the source drivers. Meanwhile, dimension of the frame is increased as well. If the number of the source drivers and/or the number of the gate drivers can be reduced, the issue of high manufacturing costs of the LCD can be easily resolved, and a narrow frame can be formed. Namely, fabrication of the LCD with a relatively small non-display region can be achieved without difficulty.

SUMMARY OF THE INVENTION

The invention is directed to a pixel array capable of maintaining a high aperture ratio and reducing V-band mura defects.

In the invention, a pixel array located on a substrate is provided. The pixel array includes a plurality of pixel sets. Each of the pixel sets includes a first scan line, a second scan line, a data line, a data signal transmission line, a first pixel unit, and a second pixel unit. The data line is not parallel to the first and the second scan lines. The data signal transmission line is disposed parallel to the first and the second scan lines and electrically connected to the data line. A distance between the first scan line and the second scan line is smaller than that between the data signal transmission line and one of the first scan line and the second scan line. The first pixel unit is electrically connected to the first scan line and the data line. The second pixel unit is electrically connected to the second scan line and the data line.

According to an embodiment of the invention, the distance between the data signal transmission line and one of the first scan line and the second scan line is equal to or greater than about 5 μm.

According to an embodiment of the invention, the substrate has a plurality of unit regions, and each of the pixel sets is located in one of the unit regions.

According to an embodiment of the invention, the first scan line and the second scan line in each of the pixel sets are disposed in a middle portion of one of the unit regions, and the data signal transmission line of each of the pixel sets is disposed in a marginal portion of one of the unit regions.

According to an embodiment of the invention, the distance between the data signal transmission line and one of the first scan line and the second scan line of each of the pixel sets is about 9% to about 38% of the length of one of the unit regions.

According to an embodiment of the invention, the first pixel unit and the second pixel unit respectively have an active device and a pixel electrode, and the active device of the first pixel unit and the active device of the second pixel unit in each of the pixel sets are disposed in a middle portion of one of the unit regions.

In the invention, another pixel array located on a substrate is provided. The pixel array includes a plurality of pixel sets. Each of the pixel sets includes a first scan line, a second scan line, a first data line, a second data line, a first data signal transmission line, a second data signal transmission line, a first pixel unit, a second pixel unit, a third pixel unit, and a fourth pixel unit. The first data line and the second data line are not parallel to the first scan line and the second scan line. The first data signal transmission line and the second data signal transmission line are disposed parallel to the first scan line and the second scan line. The first data signal transmission line is electrically connected to the first data line. The second data signal transmission line is electrically connected to the second data line. A distance between the first scan line and the second scan line is smaller than that between one of the first data signal transmission line and the second data signal transmission line and one of the first scan line and the second scan line. The first pixel unit is electrically connected to the first scan line and the first data line. The second pixel unit is electrically connected to the second scan line and the first data line. The third pixel unit is electrically connected to the first scan line and the second data line. The fourth pixel unit is electrically connected to the second scan line and the second data line.

According to an embodiment of the invention, the distance between the first data signal transmission line and one of the first scan line and the second scan line is equal to or greater than about 5 μm.

According to an embodiment of the invention, the distance between the second data signal transmission line and one of the first scan line and the second scan line is equal to or greater than about 5 μm.

According to an embodiment of the invention, the substrate has a plurality of unit regions, and each of the pixel sets is located in one of the unit regions.

According to an embodiment of the invention, the first scan line and the second scan line in each of the pixel sets are disposed in a middle portion of one of the unit regions, and the first data signal transmission line and the second data signal transmission line of each of the pixel sets are disposed in a marginal portion of one of the unit regions.

According to an embodiment of the invention, the distance between one of the first data signal transmission line and the second data signal transmission line and one of the first scan line and the second scan line of each of the pixel sets is about 9% to about 38% of the length of one of the unit regions.

According to an embodiment of the invention, each of the first, the second, the third, and the fourth pixel units has an active device and a pixel electrode. The active device of the first pixel unit, the active device of the second pixel unit, the active device of the third pixel unit, and the active device of the fourth pixel unit in each of the pixel sets are disposed in a middle portion of one of the unit regions.

Based on the above, the distance between the first scan line and the second scan line is smaller than that between the data signal transmission line and one of the first scan line and the second scan line. Hence, the design of the pixel array in the invention can keep the scan lines away from the data signal transmission line, such that coupling effects between the scan lines and the data signal transmission line are reduced, and that the potential at a connection portion between the data signal transmission line and the data line is not lowered. Thereby, the mura defects (e.g. V-band mura defects) can be minimized. Under the same half source driving (HSD) structure, the pixel array of the invention can have a relatively high aperture ratio.

It is to be understood that both the foregoing general descriptions and the following detailed embodiments are exemplary and are, together with the accompanying drawings, intended to provide further explanation of technical features and advantages of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
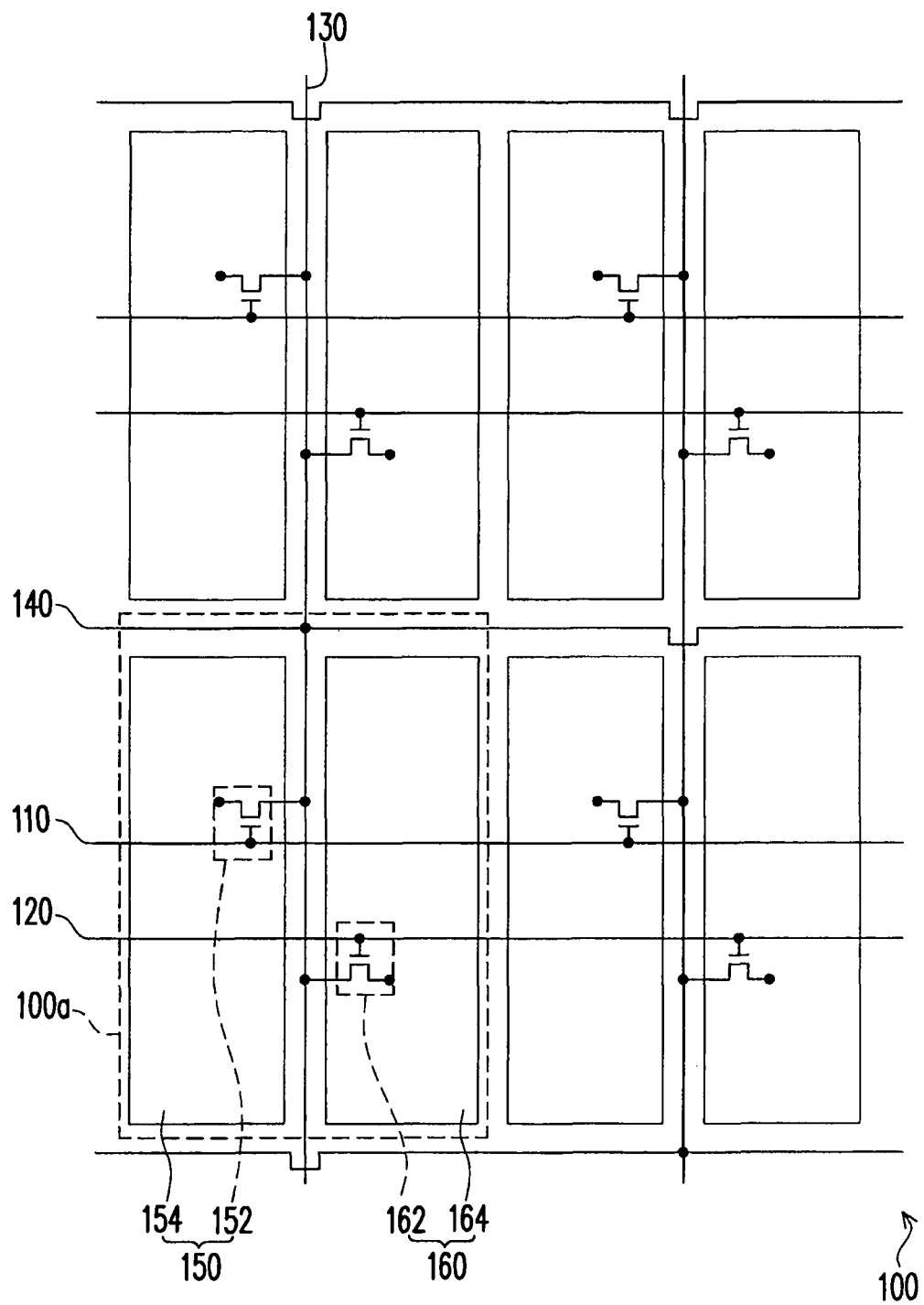
FIG. 1A is an equivalent circuit diagram illustrating a pixel array according to an embodiment of the invention.
Figure 1B:
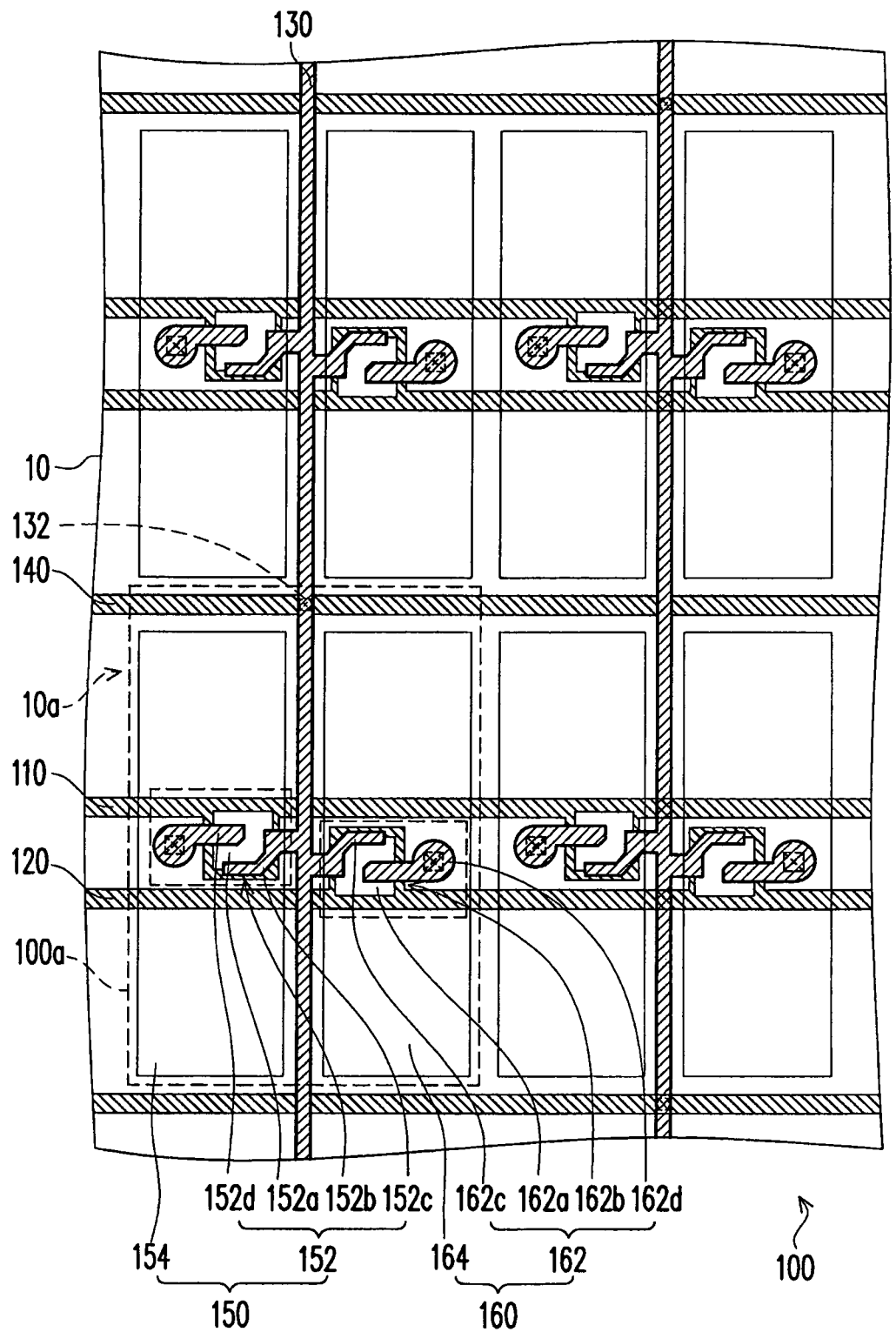
FIG. 1B is a schematic top view illustrating the pixel array depicted in FIG. 1A.

FIG. 1A is an equivalent circuit diagram illustrating a pixel array according to an embodiment of the invention. FIG. 1B is a schematic top view illustrating the pixel array depicted in FIG. 1A. As shown in FIG. 1A and FIG. 1B, the pixel array 100 of this embodiment is located on a substrate 10, and the pixel array 100 includes a plurality of pixel sets 100a. The substrate 10 has a plurality of unit regions 10a, and each of the pixel sets 100a is located in one of the unit regions 10a.

Specifically, each of the pixel sets 100a includes a first scan line 110, a second scan line 120, a data line 130, a data signal transmission line 140, a first pixel unit 150, and a second pixel unit 160. The data line 130 is not parallel to the first and the second scan lines 110 and 120. In this embodiment, the data line 130 is, for example, disposed perpendicular to the first scan line 110 and the second scan line 120, and the first scan line 110 and the second scan line 120 in each of the pixel sets 100a are substantially disposed in a middle portion of one of the unit regions 10a on the substrate 10.

The data signal transmission line 140 is disposed parallel to the first scan line 110 and the second scan line 120, and the data signal transmission line 140 is electrically connected to the data line 130 through a contact window 132. In particular, the data signal transmission line 140 of each of the pixel sets 100a is disposed in a marginal portion of one of the unit regions 10a on the substrate 10. Besides, the first scan line 110, the second scan line 120, and the data signal transmission line 140 of this embodiment are in the same film layer, for instance. That is to say, the first scan line 110, the second scan line 120, and the data signal transmission line 140 are formed in the same manufacturing process.

More specifically, according to this embodiment, the distance between the first scan line 110 and the second scan line 120 is smaller than that between the data signal transmission line 140 and one of the first scan line 110 and the second scan line 120 in each of the pixel sets 100a. In detail, the distance between the data signal transmission line 140 and one of the first scan line 110 and the second scan line 120 is equal to or greater than about 5 μm according to this embodiment. The distance between the data signal transmission line 140 and one of the first scan line 110 and the second scan line 120 of each of the pixel sets 100a is about 9% to about 38% of the length of one of the unit regions 10a on the substrate 10.

In this embodiment, each of the data signal transmission lines 140 is electrically connected to one of the data lines 130. In particular, according to this embodiment, an extension direction of each of the data signal transmission lines 140 is substantially parallel to an extension direction of the first scan line 110 and the second scan line 120. The distance between the first scan line 110 and the second scan line 120 is smaller than that between the data signal transmission line 140 and one of the first scan line 110 and the second scan line 120. As such, the design of the pixel array 100 in this embodiment not only can effectively reduce the number of fan-out traces at ends of the data line 130 in each of the pixel sets 100a, but also can keep the first and the second scan lines 110 and 120 away from the data signal transmission line 140, such that coupling effects between the first scan line 110 (or the second scan line 120) and the data signal transmission line 140 are reduced, and that the potential at a connection portion between the data signal transmission line 140 and the data line 130 is not lowered. Thereby, the mura defects (e.g. V-band mura defects) can be minimized. Here, the data signal transmission line 140 is designed to have a tracking data-line in pixel (TDP) wiring structure.

In FIG. 1A and FIG. 1B, the first pixel unit 150 of this embodiment is electrically connected to the first scan line 110 and the data line 130. The second pixel unit 160 is electrically connected to the second scan line 120 and the data line 130. Here, the first pixel unit 150 has an active device 152 and a pixel electrode 154, and the second pixel unit 160 has an active device 162 and a pixel electrode 164. The active devices 152 and 162 of the first pixel unit 150 and the second pixel unit 160 in each of the pixel sets 100a are respectively disposed in a middle portion (or area) of one of the unit regions 10a on the substrate 10, and the active devices 152 and 162, for example, are thin film transistors (TFTs) formed by channel layers 152a and 162a, gates 152b and 162b, sources 152c and 162c, and drains 152d and 162d.

The pixel array 100 of this embodiment is designed to electrically connect the two adjacent first and second pixel units 150 and 160 to the same data line 130, and therefore the required number of the data line 130 is reduced by half. Moreover, the number of in-use source drivers (not shown) can be reduced. Here, the pixel array is designed to have the HSD structure.

In brief, the HSD pixel structure together with the design of the data signal transmission line 140 (i.e. the TDP wiring structure) is employed in this embodiment. Hence, the number of the in-use data lines 130 and the number of the fan-out traces at the ends of the data lines 130 can be effectively reduced. Thereby, the design requirement for slim-border (e.g. 1.9 mm) can be readily achieved. Besides, under the conventional HSD pixel structure, the data signal transmission line 140 is disposed between the first scan line 110 and the second scan line 120, and the aperture ratio approximates 36.9%, for example. By contrast, the pixel array 100 of this embodiment has a relatively high aperture ratio approximating 42.5%, for example.

Figure 2A:
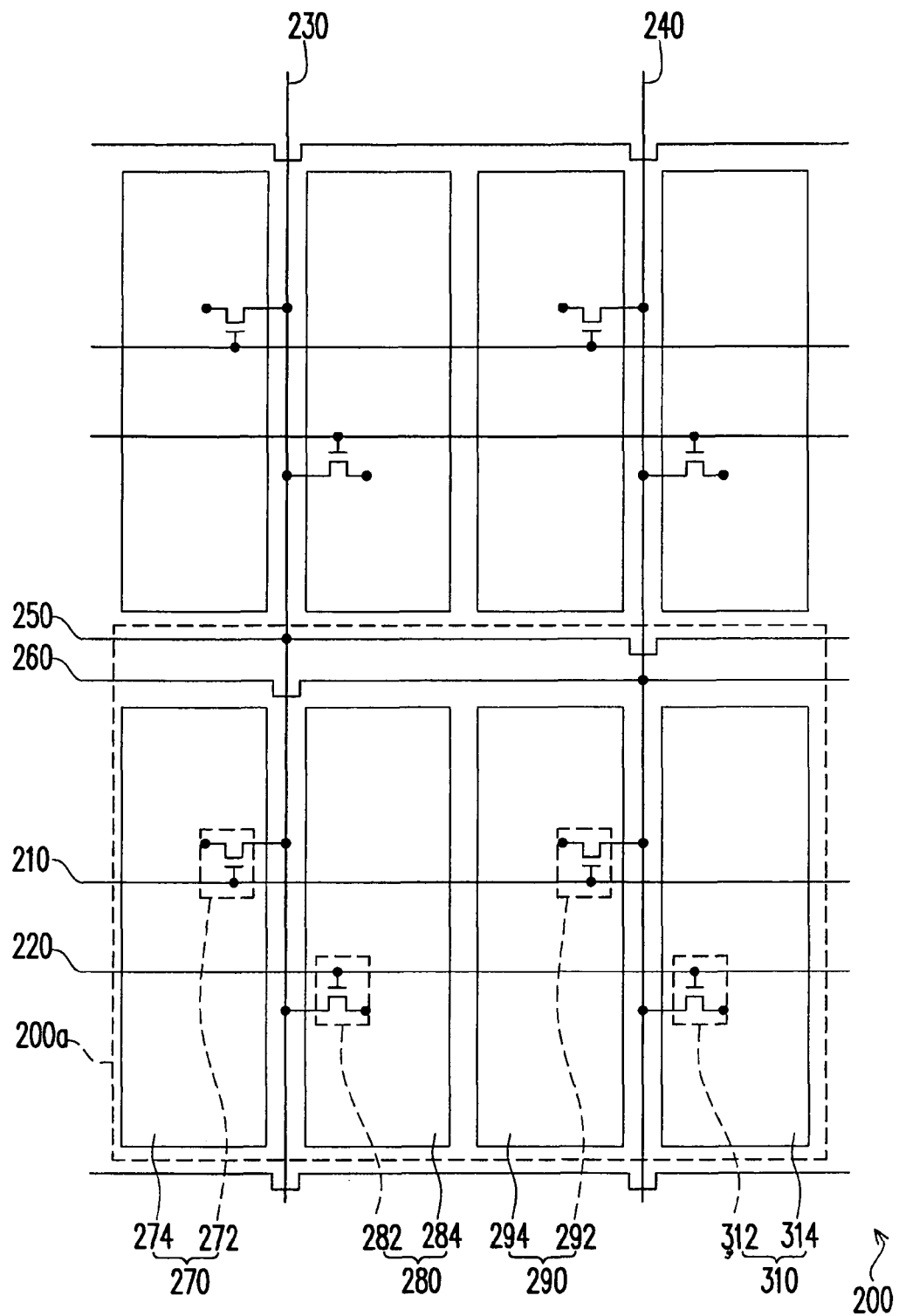
FIG. 2A is an equivalent circuit diagram illustrating a pixel array according to another embodiment of the invention.
Figure 2B:
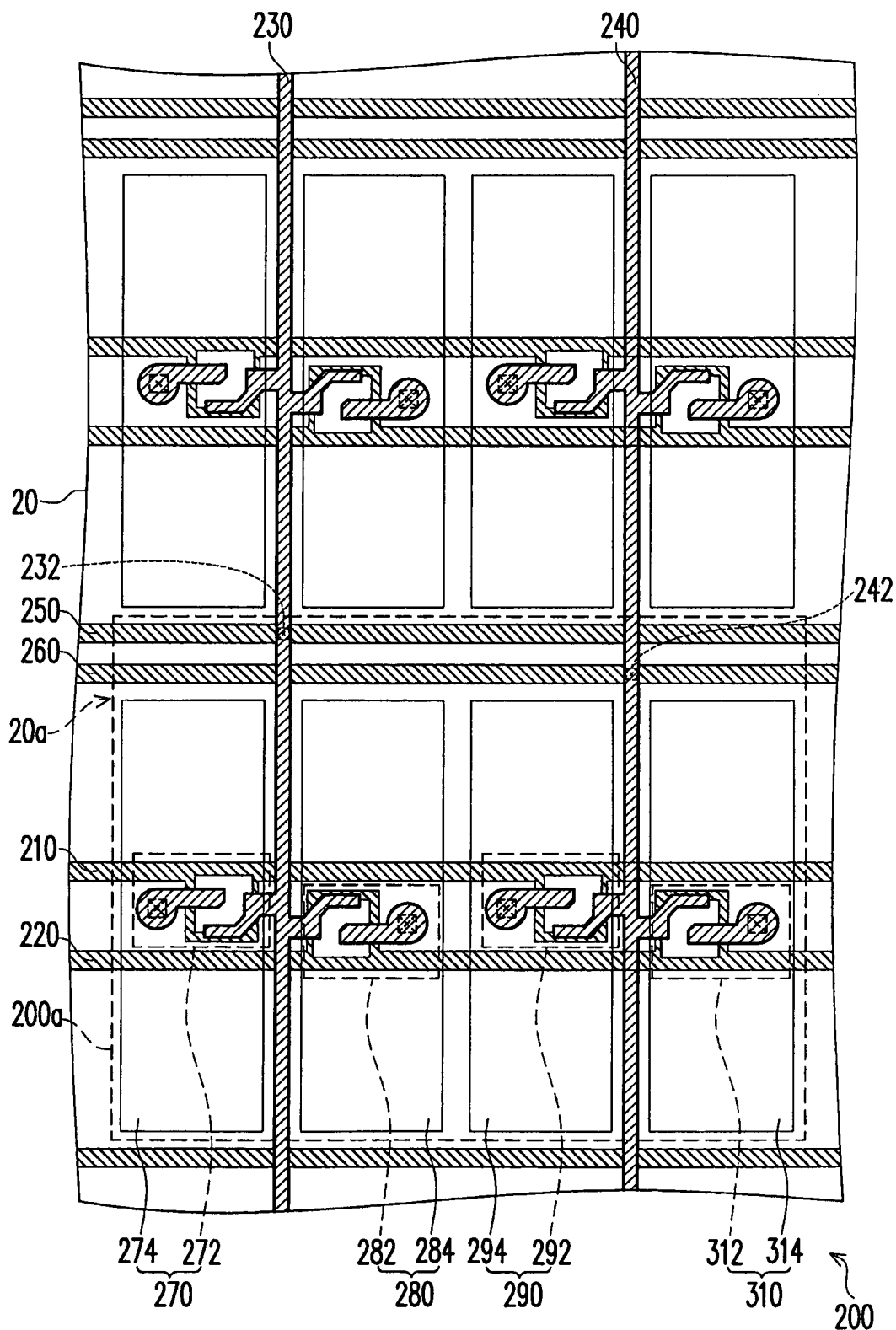
FIG. 2B is a schematic top view illustrating the pixel array depicted in FIG. 2A.

FIG. 2A is an equivalent circuit diagram illustrating a pixel array according to another embodiment of the invention. FIG. 2B is a schematic top view illustrating the pixel array depicted in FIG. 2A. As shown in FIG. 2A and FIG. 2B, to achieve the design requirement for slim-border, another pixel array 200 is provided in this embodiment. According to this embodiment, the pixel array 200 is located on a substrate 20, and the pixel array 200 includes a plurality of pixel sets 200a. The substrate 20 has a plurality of unit regions 20a, and each of the pixel sets 200a is located in one of the unit regions 20a.

Specifically, each of the pixel sets 200a includes a first scan line 210, a second scan line 220, a first data line 230, a second data line 240, a first data signal transmission line 250, a second data signal transmission line 260, a first pixel unit 270, a second pixel unit 280, a third pixel unit 290, and a fourth pixel unit 310. The first data line 230 and the second data line 240 are not parallel to the first scan line 210 and the second scan line 220. In this embodiment, the first data line 230 and the second data line 240 are, for example, disposed perpendicular to the first scan line 210 and the second scan line 220, and the first scan line 210 and the second scan line 220 in each of the pixel sets 200a are substantially disposed in a middle portion of one of the unit regions 20a on the substrate 20.

The first data signal transmission line 250 and the second data signal transmission line 260 are parallel to the first scan line 210 and the second scan line 220. The first data signal transmission line 250 is electrically connected to the first data line 230 through a contact window 232. The second data signal transmission line 260 is electrically connected to the second data line 240 through a contact window 242. In particular, the first data signal transmission line 250 and the second data signal transmission line 260 of each of the pixel sets 200a are disposed in a marginal portion of one of the unit regions 20a on the substrate 20. Besides, the first scan line 210, the second scan line 220, the first data signal transmission line 250, and the second data signal transmission line 260 of this embodiment are in the same film layer, for instance. That is to say, the first scan line 210, the second scan line 220, the first data signal transmission line 250, and the second data signal transmission line 260 are formed in the same manufacturing process.

Particularly, in each of the pixel sets 200a of this embodiment, distance between the first scan line 210 and the second scan line 220 is smaller than that between one of the first data signal transmission line 250 and the second data signal transmission line 260 and one of the first scan line 210 and the second scan line 220. In detail, distance between the first data signal transmission line 250 and one of the first scan line 210 and the second scan line 220 is equal to or greater than about 5 µm. The distance between the second data signal transmission line 260 and one of the first scan line 210 and the second scan line 220 is equal to or greater than about 5 µm. The distance between one of the first data signal transmission line 250 and the second data signal transmission line 260 and one of the first scan line 210 and the second scan line 220 of each of the pixel sets 200a is about 9% to about 38% of the length of one of the unit regions 20a on the substrate 20.

In this embodiment, each of the data signal transmission lines (e.g. the first data signal transmission line 250 and the second data signal transmission line 260) is electrically connected to one of the data lines (e.g. the first data line 230 and the second data line 240). To be more specific, according to this embodiment, an extension direction of the first data signal transmission line 250 and the second data signal transmission line 260 is substantially parallel to an extension direction of the first scan line 210 and the second scan line 220. The distance between the first scan line 210 and the second scan line 220 is smaller than that between one of the first data signal transmission line 250 and the second data signal transmission line 260 and one of the first scan line 210 and the second scan line 220. As such, the design of the pixel array 200 in this embodiment not only can effectively reduce the number of fan-out traces at ends of the data lines (including the first and the second data lines 230 and 240), but also can keep the first and the second scan lines 210 and 220 away from the first data signal transmission line 250 and the second data signal transmission line 260, such that coupling effects between the first scan line 210 (or the second scan line 220) and the first data signal transmission line 250 (or the second data signal transmission line 260) are reduced, and that the potential at a connection portion between the first data signal transmission line 250 and the first data line 230 is not lowered (or the potential at a connection portion between the second data signal transmission lien 260 and the second data line 240 is not lowered). Thereby, the mura defects (e.g. V-band mura defects) can be minimized. Here, the first and the second data signal transmission lines 250 and 260 are designed to have the TDP wiring structure.

In FIG. 2A and FIG. 2B, the first pixel unit 270 of this embodiment is electrically connected to the first scan line 210 and the first data line 230. The second pixel unit 280 is electrically connected to the second scan line 220 and the first data line 230. The third pixel unit 290 is electrically connected to the first scan line 210 and the second data line 240. The fourth pixel unit 310 is electrically connected to the second scan line 220 and the second data line 240. The first, the second, the third, and the fourth pixel units 270, 280, 290, and 310 respectively have an active device 272, 282, 292, and 312 and a pixel electrode 274, 284, 294, and 314. The active device 272 of the first pixel unit 270, the active device 282 of the second pixel unit 280, the active device 292 of the third pixel unit 290, and the active device 312 of the fourth pixel unit 310 in each of the pixel sets 200a are disposed in a middle portion of one of the unit regions 20a on the substrate 20.

The pixel array 200 of this embodiment is designed to electrically connect the two adjacent first and second pixel units 270 and 280 to the same data line (i.e. the first data line 230) and electrically connect the two adjacent third and fourth pixel units 290 and 310 to the same data line (i.e. the second data line 240). Therefore, the required number of the data lines is reduced by half, and the number of in-use source drivers (not shown) can be reduced as well. Here, the pixel array is designed to have the HSD structure.

In brief, the HSD pixel structure together with the design (i.e. the TDP wiring structure) of the data signal transmission lines (including the first and the second data signal transmission lines 250 and 260) is employed in this embodiment. Hence, in comparison with the pixel array 100 depicted in FIG. 1B, the pixel array 200 of this embodiment can have the reduced number of the in-use data lines (including the first and the second data lines 230 and 240) and the reduced number of the fan-out traces at the ends of the data lines. Thereby, the design requirement for slim-border (e.g. 0.9 mm) can be readily achieved.

In light of the foregoing, the distance between the first scan line and the second scan line is smaller than that between the data signal transmission line and one of the first scan line and the second scan line in this invention. Hence, the design of the pixel array in the invention can keep the scan lines away from the data signal transmission line, such that coupling effects between the scan lines and the data signal transmission line are reduced, and that the potential at a connection portion between the data signal transmission line and the data line is not lowered. Thereby, the mura defects (e.g. V-band mura defects) can be minimized. Under the same HSD structure, the pixel array of the invention can hive a relatively high aperture ratio.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A pixel array on a substrate comprising:
   a plurality of pixel sets, each of the pixel sets comprising:
      a first scan line and a second scan line;
      a data line not parallel to the first and the second scan lines;
      a data signal transmission line disposed parallel to the first and the second scan lines and electrically connected to the data line, wherein a distance between the first scan line and the second scan line is smaller than that between the data signal transmission line and one of the first scan line and the second scan line;
      a first pixel unit electrically connected to the first scan line and the data line; and
      a second pixel unit electrically connected to the second scan line and the data line.

2. The pixel array as claimed in claim 1, wherein the distance between the data signal transmission line and one of the first scan line and the second scan line is substantially equal to or greater than about 5 μm.

3. The pixel array as claimed in claim 1, wherein the substrate has a plurality of unit regions, and each of the pixel sets is located in one of the unit regions.

4. The pixel array as claimed in claim 3, wherein the first scan line and the second scan line of each of the pixel sets are disposed in a middle portion of one of the unit regions, and the data signal transmission line of each of the pixel sets is disposed in a marginal portion of one of the unit regions.

5. The pixel array as claimed in claim 3, wherein the distance between the data signal transmission line and one of the first scan line and the second scan line of each of the pixel sets is about 9% to about 38% of the length of one of the unit regions.

6. The pixel array as claimed in claim 3, wherein each of the first pixel unit and the second pixel unit includes an active device and a pixel electrode, and the active device of the first pixel unit and that of the second pixel unit of each of the pixel sets are disposed in a middle portion of one of the unit regions.

7. A pixel array on a substrate, comprising:
   a plurality of pixel sets, each of the pixel sets comprising:
      a first scan line and a second scan line;
      a first data line and a second data line which are not parallel to the first and the second scan lines;
      a first data signal transmission line and a second data signal transmission line both disposed parallel to the first scan line and the second scan line, the first data signal transmission line being electrically connected to the first data line, the second data signal transmission line being electrically connected to the second data line, wherein a distance between the first scan line and the second scan line is smaller than that between one of the first data signal transmission line and the second data signal transmission line and one of the first scan line and the second scan line;
      a first pixel unit electrically connected to the first scan line and the first data line;
      a second pixel unit electrically connected to the second scan line and the first data line;
      a third pixel unit electrically connected to the first scan line and the second data line; and
      a fourth pixel unit electrically connected to the second scan line and the second data line.

8. The pixel array as claimed in claim 7, wherein the distance between the first data signal transmission line and one of the first scan line and the second scan line is equal to or greater than about 5 μm.

9. The pixel array as claimed in claim 7, wherein the distance between the second data signal transmission line and one of the first scan line and the second scan line is equal to or greater than about 5 μm.

10. The pixel array as claimed in claim 7, wherein the substrate has a plurality of unit regions, and each of the pixel sets is located in one of the unit regions.

11. The pixel array as claimed in claim 10, wherein the first scan line and the second scan line of each of the pixel sets are disposed in a middle portion of one of the unit regions, and the first data signal transmission line and the second data signal transmission line of each of the pixel sets are disposed in a marginal portion of one of the unit regions.

12. The pixel array as claimed in claim 10, wherein the distance between one of the first data signal transmission line and the second data signal transmission line and one of the first scan line and the second scan line of each of the pixel sets is about 9% to about 38% of the length of one of the unit regions.

13. The pixel array as claimed in claim 10, wherein each of the first pixel unit, the second pixel unit, the third pixel unit, and the fourth pixel unit includes an active device and a pixel electrode, and the active device of the first pixel unit, the active device of the second pixel unit, the active device of the third pixel unit, and the active device of the fourth pixel unit of each of the pixel sets are disposed in a middle portion of one of the unit regions.

* * * * *